United States Patent
Chen et al.

(10) Patent No.: US 8,238,184 B2
(45) Date of Patent: Aug. 7, 2012

(54) SENSE AMPLIFIER WITH A SENSING TRANSMISSION TRANSISTOR AND A REFERENCE TRANSMISSION TRANSISTOR OPERATING IN SATURATION REGIONS AND DATA SENSING METHOD THEREOF

(75) Inventors: Chung-Kuang Chen, Pan Chiao (TW); Yi-Te Shih, Zhubei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/038,606

(22) Filed: Mar. 2, 2011

(65) Prior Publication Data

US 2011/0149669 A1 Jun. 23, 2011

Related U.S. Application Data

(62) Division of application No. 12/127,871, filed on May 28, 2008, now abandoned.

(51) Int. Cl.
*G11C 7/06* (2006.01)
*G11C 7/14* (2006.01)

(52) U.S. Cl. ............... 365/210.1; 365/208; 365/207; 365/205; 365/190; 365/196

(58) Field of Classification Search .......... 365/185.17, 365/185.21, 185.2, 205, 190, 196, 195, 210.12, 365/210.1, 208, 207
See application file for complete search history.

(56) References Cited

U.S. PATENT DOCUMENTS

| | | | |
|---|---|---|---|
| 5,521,868 A | 5/1996 | Nobukata | |
| 5,729,492 A | 3/1998 | Campardo | |
| 5,850,366 A | 12/1998 | Coleman, Jr. | |
| 6,266,286 B1 | 7/2001 | Cho et al. | |
| 6,559,702 B2 | 5/2003 | Hinterscher | |
| 6,724,673 B2 | 4/2004 | Covarel et al. | |
| 7,050,346 B2 | 5/2006 | Maejima et al. | |
| 7,305,513 B2 | 12/2007 | Chen | |
| 7,633,809 B2 * | 12/2009 | Kajiyama | 365/185.25 |
| 7,733,718 B2 * | 6/2010 | Kang et al. | 365/196 |
| 2004/0001363 A1 | 1/2004 | King | |
| 2009/0046529 A1 | 2/2009 | Chen et al. | |

OTHER PUBLICATIONS

Taiwanese language office action dated May 30, 2012.

* cited by examiner

*Primary Examiner* — Andrew Q Tran
(74) *Attorney, Agent, or Firm* — Thomas, Kayden, Horstemeyer & Risley, LLP

(57) ABSTRACT

A data sensing method for sensing storage data stored in a memory cell includes the steps of: biasing a sensing node and a reference node to a first voltage in response to a first control signal; discharging the sensing node and the reference node via the memory cell and a reference memory cell, respectively; enabling a latch circuit to amplify a voltage difference between the sensing node and the reference node.

9 Claims, 7 Drawing Sheets

10

SENSE AMPLIFIER WITH A SENSING TRANSMISSION TRANSISTOR AND A REFERENCE TRANSMISSION TRANSISTOR OPERATING IN SATURATION REGIONS AND DATA SENSING METHOD THEREOF

This application is a divisional application of co-pending application Ser. No. 12/127,871, filed on May 28, 2008, the contents of which are incorporated herein by reference.

BACKGROUND OF THE INVENTION

1. Field of the Invention

The invention relates in general to a sense amplifier, and more particularly to a sense amplifier for amplifying a sensing voltage and a reference voltage via a latch circuit.

2. Description of the Related Art

In the modern age having the technology changing with each passing day, a non-volatile memory, such as a flash, is widely used in various electronic products. Conventionally, when storage data recorded in a memory cell of the flash is to be read, the memory cell is biased through a column decoder and a row decoder so that the memory cell generates a sensing current. Thereafter, the sensing current is compared with a reference current through a sense amplifier so that the storage data can be judged.

With the technological development which changes with each passing day, the sensing current of the flash is reduced in the more advanced manufacturing technique so that the flash has the lower power consumption and the higher access speed. However, the lower sensing current causes the sense amplifier to have the smaller sensing margin so that the sense amplifier tends to obtain the incorrectly stored data. Therefore, it is an important subject in the industry to develop the technology capable of effectively enhancing the data sensing accuracy of the sense amplifier.

SUMMARY OF THE INVENTION

The invention is directed to a sense amplifier and a data sensing method thereof, wherein the sense amplifier of the invention advantageously has the higher data sensing accuracy than the conventional sense amplifier.

According to a first aspect of the present invention, a sense amplifier for sensing storage data stored in a memory cell of a memory is provided. The sense amplifier includes a sensing node, a reference node, first and second bias circuits, first and second transmission circuits and a latch circuit. The first bias circuit biases the sensing node to a first voltage in response to a first control signal. The second bias circuit biases the reference node to the first voltage in response to the first control signal. The first transmission circuit discharges the sensing node via the memory cell. The second transmission circuit discharges the reference node via a reference memory cell. The latch circuit amplifies a voltage difference between the sensing node and the reference node.

According to a second aspect of the present invention, a data sensing method for sensing storage data stored in a memory cell of a memory is provided. The data sensing method includes the following steps. First, a sensing node and a reference node are biased to a first voltage in response to a first control signal. Then, the sensing node is discharged via the memory cell, and the reference node is discharged via a reference memory cell. Next, a latch circuit is enabled to amplify a voltage difference between the sensing node and the reference node.

The invention will become apparent from the following detailed description of the preferred but non-limiting embodiments. The following description is made with reference to the accompanying drawings.

DETAILED DESCRIPTION OF THE INVENTION

First Embodiment

Figure 1:
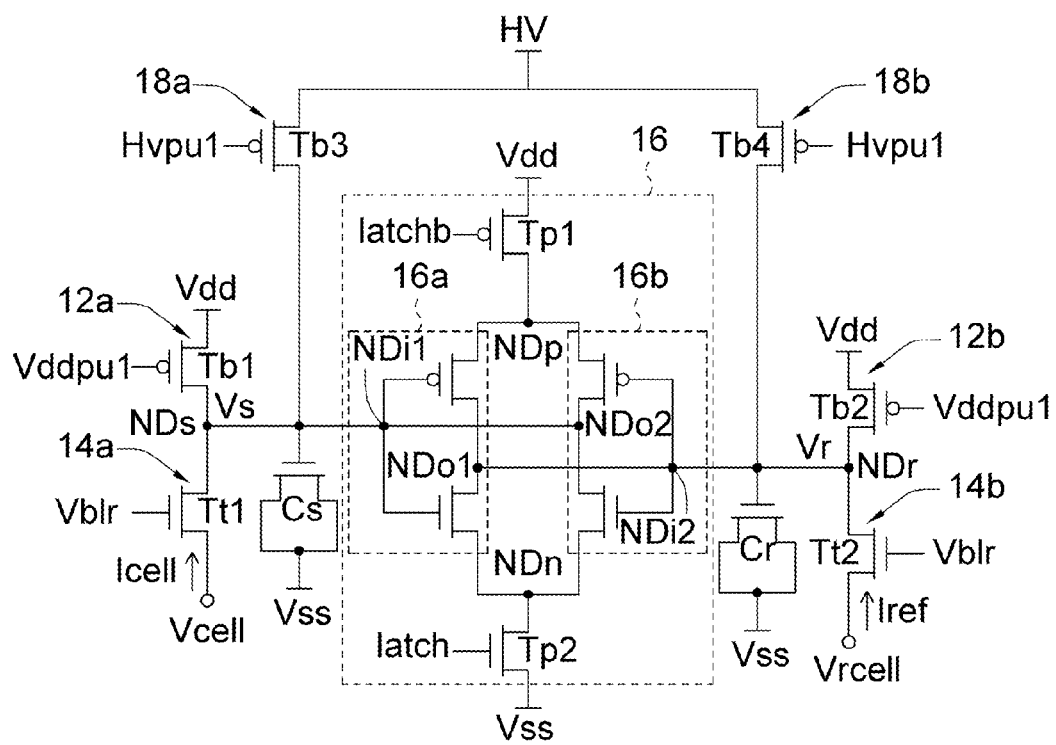
FIG. 1 is a circuit diagram showing a sense amplifier according to a first embodiment of the invention.
Figure 2:
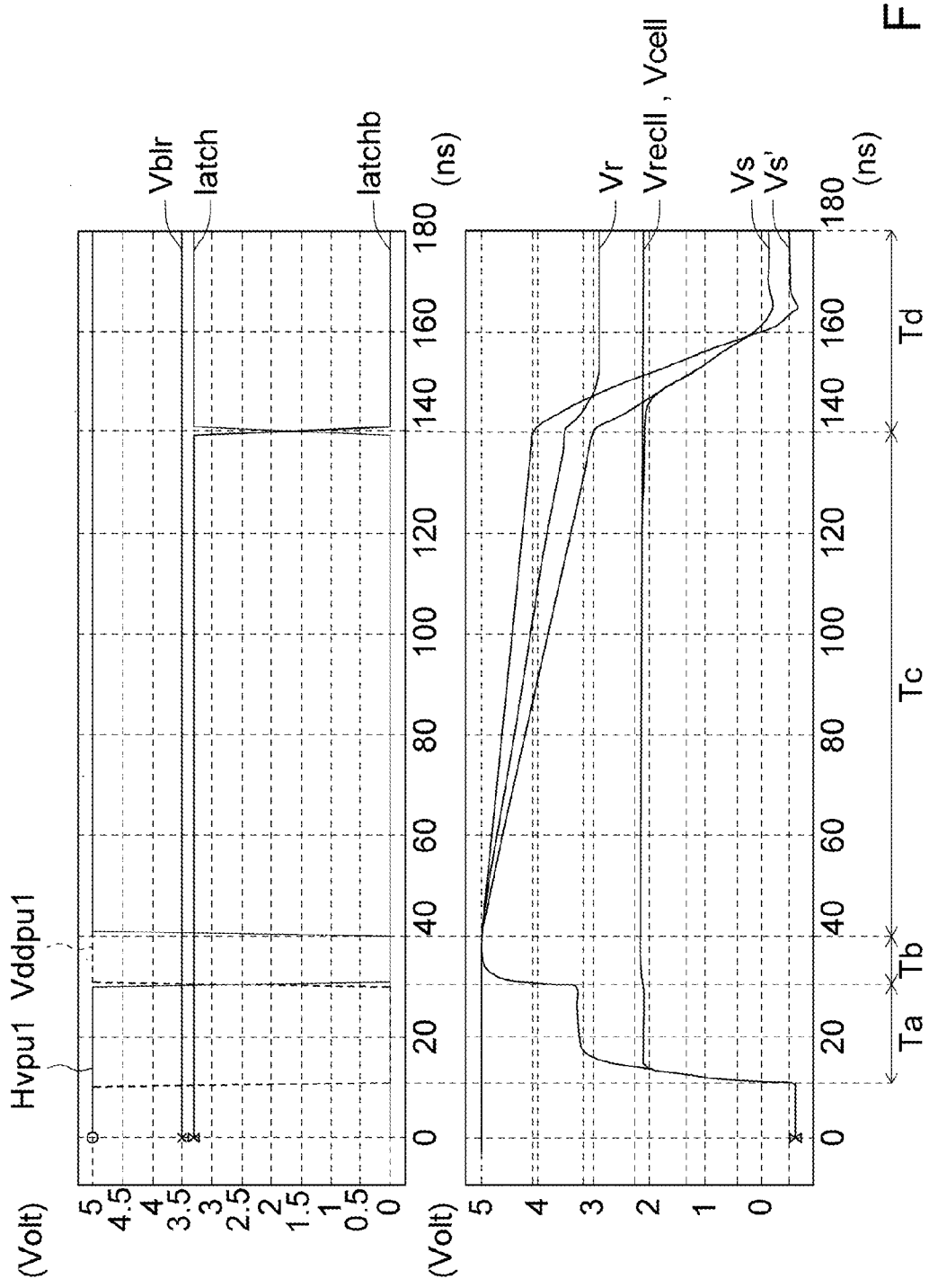
FIG. 2 is a timing chart showing signals associated with the sense amplifier of FIG. 1.

FIG. 1 is a circuit diagram showing a sense amplifier 10 according to a first embodiment of the invention. FIG. 2 is a timing chart showing signals associated with the sense amplifier of FIG. 1. As shown in FIGS. 1 and 2, the sense amplifier 10 senses storage data stored in a memory cell (not shown) of a memory (not shown) according to a cell current Icell provided by the memory cell of the memory (not shown).

The sense amplifier 10 includes a sensing node NDs, a reference node NDr, bias circuits 12a, 12b, 18a and 18b, transmission circuits 14a and 14b and a latch circuit 16. The bias circuit 12a and the transmission circuit 14a are electrically connected to the sensing node NDs, the bias circuit 12b and the transmission circuit 14b are electrically connected to the reference node NDr, and the latch circuit 16 is electrically connected to the sensing node NDs and the reference node NDr. The voltage on the sensing node NDs is a sensing voltage Vs, while the voltage on the reference node NDr is a reference voltage Vr. For example, the data stored in the memory cell is 0 and the correspondingly curve of the sensing voltage Vs is shown in FIG. 2.

The bias circuits 12a and 12b are enabled in response to an enabled level of a control signal Vddpul to respectively bias the sensing voltage Vs and the reference voltage Vr to voltages approaching a voltage Vdd. For example, the voltage Vdd is a circuit high voltage of the sense amplifier 10, and the control signal Vddpul has the enabled level in an active period Ta.

For example, the bias circuits 12a and 12b respectively include P-type metal oxide semiconductor (PMOS) transistors Tb1 and Tb2. The PMOS transistor Tb1 has a source for receiving the voltage Vdd, a drain electrically connected to the sensing node NDs and a gate for receiving the control signal Vddpul. The PMOS transistor Tb2 has a source for receiving the voltage Vdd, a drain electrically connected to the reference node NDr and a gate for receiving the control signal Vddpul. The PMOS transistors Tb1 and Tb2 are enabled in response to the enabled level of the control signal Vddpul to respectively bias the sensing voltage Vs and the reference voltage Vr to the voltages approaching the voltage Vdd. For example, the enabled level of the control signal Vddpul is a signal low level.

The bias circuits 18a and 18b are enabled in response to an enabled level of a control signal Hvpul to respectively bias the sensing voltage Vs and the reference voltage Vr to voltages approaching a voltage HV. The voltage HV has a level higher than a level of the voltage Vdd. In this embodiment, the levels of the voltages HV and Vdd are 5V (volts) and 2.8V, for example, and the control signal Hvpul has the enabled level in an active period Tb.

For example, the bias circuits 18a and 18b respectively include PMOS transistors Tb3 and Tb4. The operations of the PMOS transistors Tb3 and Tb4 are similar to those of the PMOS transistors Tb1 and Tb2. The PMOS transistors Tb3 and Tb4 are enabled in response to the enabled level of the control signal Hvpul to respectively bias the sensing voltage Vs and the reference voltage Vr to the voltages approaching the voltage HV. The enabled level of the control signal Hvpul is a signal low level, for example.

The transmission circuits 14a and 14b respectively receive the cell current Icell generated by the memory cell and a reference current Iref generated by a reference memory cell (not shown) and respectively provide the cell current Icell and the reference current Iref to the sensing node NDs and the reference node NDr. Thus, the sensing voltage Vs is discharged via the cell current Icell, and the reference voltage Vr is discharged via the reference current Iref.

For example, the transmission circuits 14a and 14b respectively include N-type metal oxidation semiconductor (NMOS) transistors Tt1 and Tt2. The NMOS transistor Tt1 has a source for receiving the cell current Icell, a drain coupled to the sensing node NDs and a gate for receiving a control signal Vblr. The NMOS transistor Tt2 has a source, which is coupled to the reference memory cell (not shown) and receives the reference current Iref provided therefrom, a drain coupled to the reference node NDr and a gate for receiving the control signal Vblr. The NMOS transistors Tt1 and Tt2 are enabled in response to the enabled level of the control signal Vblr to respectively provide the cell current Icell to discharge the sensing voltage Vs, and provide the reference current Iref to discharge the reference voltage Vr.

Preferably, in an active period Tc when the sensing voltage Vs is discharged via the cell current Icell provided by the NMOS transistor Tt1 and the reference voltage is discharged via the reference current Iref provided by the NMOS transistor Tt2, the NMOS transistors Tt1 and Tt2 are continuously biased to saturation region of the transistors. Consequently, the NMOS transistor Tt1 is biased to provide the stable cell current Icell to discharge the sensing voltage Vs. The NMOS transistor Tt2 is biased to provide the stable reference current Iref to discharge the reference voltage Vr.

More specifically, it is better to ensure that the NMOS transistors Tt1 and Tt2 operate in the saturation region in the active period Tc. Consequently, the voltage HV has to be designed according to the conditions mentioned hereinabove so that the sensing voltage Vs and the reference voltage Vr are respectively substantially greater than the voltages Vcell and Vrcell.

In this embodiment, the voltages Vcell and Vrcell substantially approach 2.1V in the active period Tc, the sensing voltage Vs is discharged from a voltage approaching 5V to a voltage approaching 3.5V via the cell current Icell, and the reference voltage Vr is discharged from a voltage approaching 5V to a voltage approaching 3V via the reference current Iref. Consequently, the transistors Tt1 and Tt2 may be biased to the saturation region in the active period Tc.

The latch circuit 16 is enabled in response to enabled levels of control signals "latch" and "latchb" to amplify a voltage difference between the sensing voltage Vs, which is obtained after the discharge via the cell current Icell, and the reference voltage Vr, which is obtained after the discharge via the reference current Iref. Thus, the storage data can be obtained by comparing the amplified voltage difference between the sensing voltage Vs and the amplified reference voltage Vr. In this embodiment, the control signals "latch" and "latchb" have the enabled levels in an active period Td, for example.

For example, the latch circuit 16 includes transistors Tp1 and Tp2 and inverters 16a and 16b. The inverter 16a includes an input terminal NDi1, an output terminal NDo1 and two power input terminals (not shown). The input terminal NDi1 and the output terminal NDo1 of the inverter 16a are respectively coupled to the sensing node NDs and the reference node NDr, and the two power input terminals of the inverter 16a are respectively coupled to nodes NDp and NDn. The inverter 16b has an input terminal NDi2, an output terminal NDo2 and two power input terminals (not shown). The input terminal NDi2 and the output terminal NDo2 of the inverter 16b are respectively coupled to the reference node NDr and the sensing node NDs, and the two power input terminals of the inverter 16b are respectively coupled to the nodes NDp and NDn.

The transistor Tp1 is, for example, a PMOS transistor having a source for receiving the voltage Vdd, a drain coupled to the node NDp and a gate for receiving the control signal "latchb". The transistor Tp1 is enabled in response to the enabled level of the control signal "latchb" to provide the voltage Vdd to the node NDp. The transistor Tp2 is, for example, a NMOS transistor having a source for receiving a voltage Vss, a drain coupled to the node NDn and a gate for receiving the control signal "latch". The transistor Tp2 is enabled in response to the enabled level of the control signal "latch" to provide the voltage Vss to the node NDn.

In this embodiment, the control signals "latch" and "latchb" are inverse signals, and the enabled levels of the control signals "latch" and "latchb" are respectively a signal high level and a signal low level. Consequently, the transistors Tp1 and Tp2 are enabled in the active period Td when the control signals "latchb" and "latch" simultaneously have the enabled levels in order to provide the voltage Vdd to the node NDp and provide the voltage Vss to the node NDn in response to the control signals "latchb" and "latch", respectively. Consequently, the inverters 16a and 16b of the latch circuit 16 form a circuit loop in the active period Td so that the latch circuit 16 is enabled and the voltage difference between the sensing voltage Vs and the reference voltage Vr may be amplified.

The sense amplifier 10 of this embodiment further has storage capacitors Cs and Cr, which have first terminals respectively coupled to the sensing node NDs and the reference node NDr, and second terminals for receiving the voltage Vss, wherein the voltage Vss is a ground voltage, for example. The storage capacitors Vs and Cr temporarily store the sensing voltage Vs and the reference voltage Vr. In this embodiment, the storage capacitors Cs and Cr may also be omitted from the sense amplifier 10, and the sensing voltage Vs and the reference voltage Vr are temporarily stored directly in an equivalent parasitic capacitor, which is viewed from the sensing node NDs, and an equivalent parasitic capacitor, which is viewed from the reference node NDr.

In this illustrated embodiment, the latch circuit 16 includes the transistors Tp1 and Tp2, which are respectively enabled in response to the control signals "latchb" and "latch" to respective provide the voltages Vdd and Vss to the inverters 16a and 16b to enable the latch circuit 16. However, the latch circuit 16 of this embodiment is not restricted to the condition wherein the transistors Tp1 and Tp2 are simultaneously included to enable the latch circuit 16. For example, one of the transistors Tp1 and Tp2 may also be omitted from the latch circuit 16 of this embodiment so that the latch circuit 16 is enabled only via one of the control signals "latchb" and "latch".

In this illustrated embodiment, the data stored in the memory cell is exemplified to be 0. However, the data stored in the memory cell is not limited to be 0. For example, when the data stored in the memory cell is 1, the correspondingly voltage variation is illustrated as curve Vs' shown in the FIG. 2.

Figure 3:
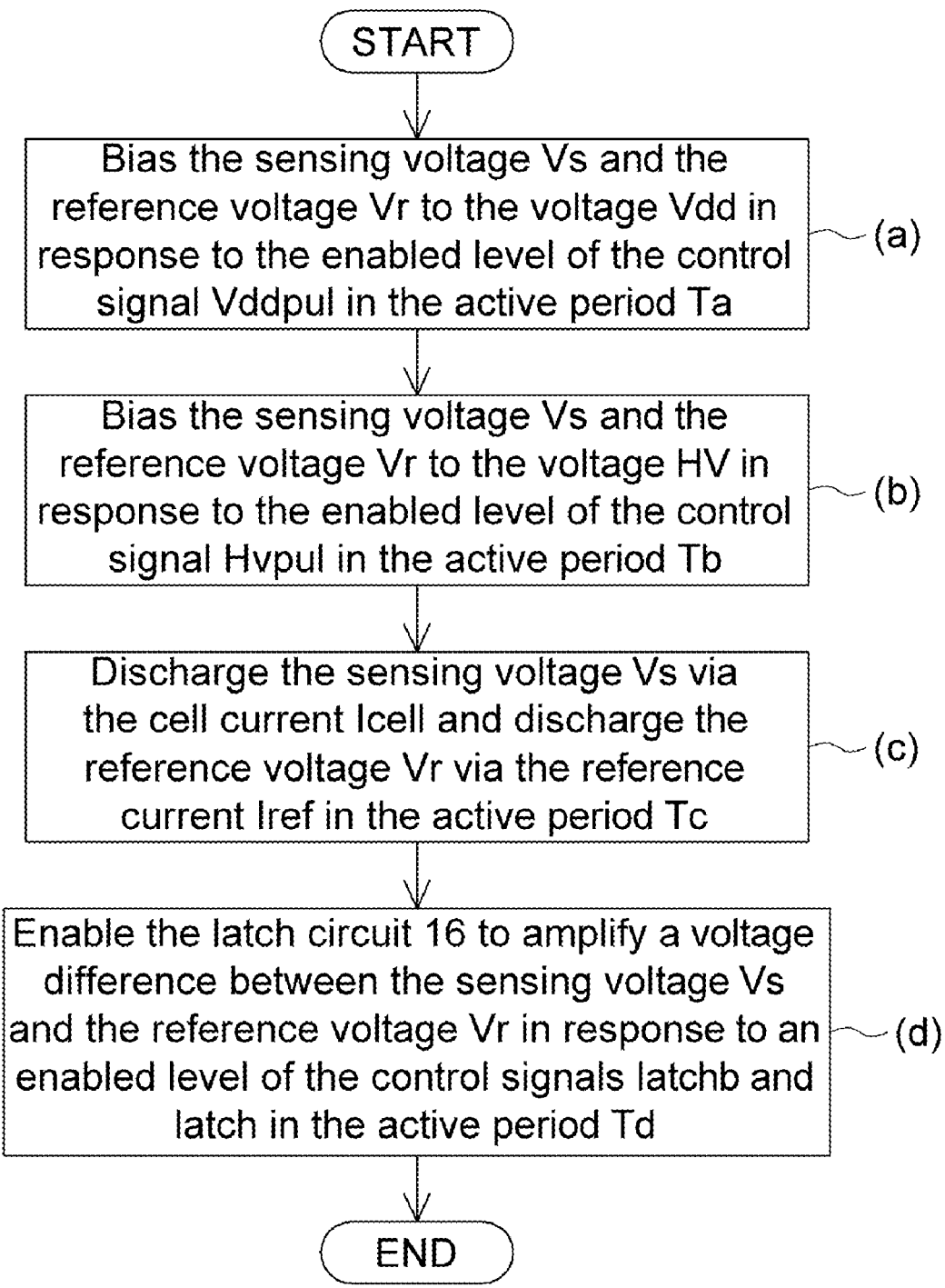
FIG. 3 is a flow chart showing a data sensing method according to the first embodiment of the invention.

FIG. 3 is a flow chart showing a data sensing method according to the first embodiment of the invention. Referring to FIG. 3, the data sensing method for sensing the storage data stored in the memory cell according to the embodiment of the invention includes the following steps. First, as shown in step (a), the bias circuits 12a and 12b respectively bias the sensing voltage Vs on the sensing node NDs to the voltage Vdd and bias the reference voltage Vr on the reference node NDr to the voltage Vdd in response to the enabled level of the control signal Vddpul in the active period Ta. Next, as shown in step (b), the bias circuits 18a and 18b respectively bias the sensing voltage Vs to the voltage HV and bias the reference voltage Vr to the voltage HV in response to the enabled level of the control signal Hvpul in the active period Tb.

Then, as shown in step (c), the transmission circuit 14a provides the cell current Icell to discharge the sensing voltage Vs, and the transmission circuit 14b provides the reference current Iref to discharge the reference voltage Vr in the active period Tc. Thereafter, as shown in step (d), the latch circuit 16 is enabled in response to the enabled levels of the control signals "latchb" and "latch" to amplify the voltage difference between the sensing voltage Vs and the reference voltage Vr in the active period Td.

In the step (d) of the data sensing method according to this embodiment, although the latch circuit 16 is enabled in response to the enabled levels of the control signals "latchb" and "latch", the latch circuit 16 may also be simply modified such that the latch circuit 16 can operate in response to only one of the control signals "latchb" and "latch" in the step (d) of this embodiment.

The sense amplifier of this embodiment amplifies the voltage difference between the sensing voltage and the reference voltage through the latch circuit. Thus, the sensing margin of the sense amplifier of this embodiment becomes larger. Consequently, even if the sensing current of this embodiment and that of the prior art have the similar values, the sense amplifier of this embodiment still has the advantage of the higher data sensing accuracy.

In addition, the sense amplifier of this embodiment biases the sensing voltage and the reference voltage to the voltages having the levels substantially higher than the circuit high voltage through two bias circuits. Therefore, the transistors for discharging the sensing voltage via the sensing current and discharging the reference voltage via the reference current may be effectively biased to the saturation region so that the values of the sensing current and the reference current substantially become stable. Consequently, the sense amplifier of this embodiment is free from the deviations of the reference voltage and the sensing voltage caused by the unstable values of the sensing current and the reference current and thus the error storage data detected according to the reference voltage and the sensing voltage having the level deviations.

Second Embodiment

Figure 4:
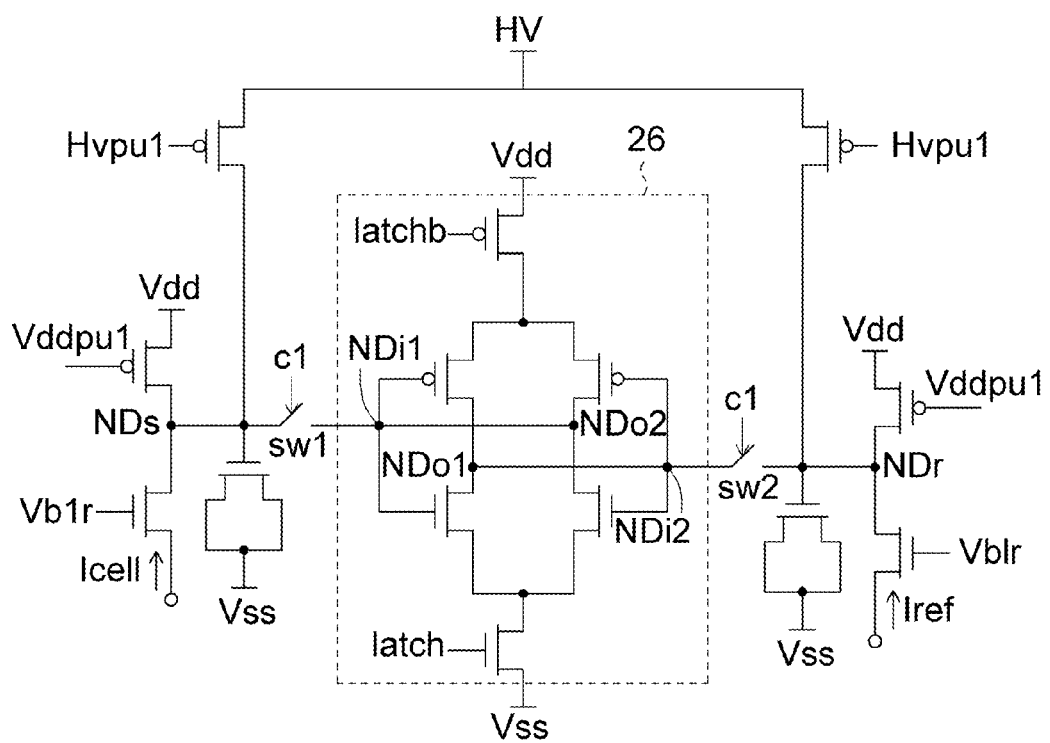
FIG. 4 is a circuit diagram showing a sense amplifier according to a second embodiment of the invention.
Figure 5:
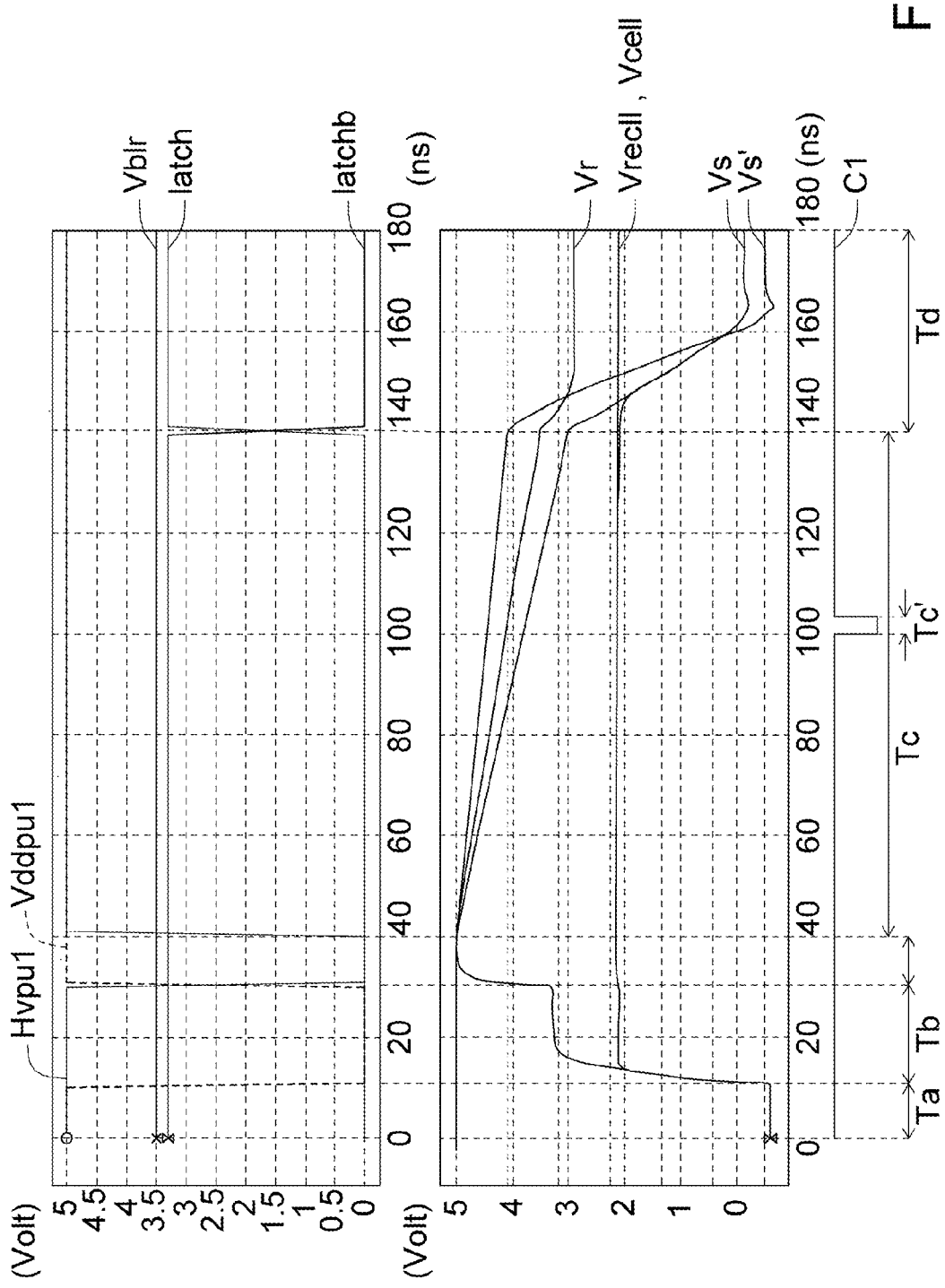
FIG. 5 is a timing chart showing signals associated with the sense amplifier of FIG. 4.

FIG. 4 is a circuit diagram showing a sense amplifier 20 according to a second embodiment of the invention. FIG. 5 is a timing chart showing signals associated with the sense amplifier of FIG. 4. The difference between the sense amplifier 20 of this embodiment and the sense amplifier 10 of the first embodiment is that the sensing node NDs is connected to the input terminal NDi1 of a latch circuit 26 via a switch circuit SW1, and the reference node NDr is connected to the input terminal NDi2 of the latch circuit 26 via a switch circuit SW2. The switch circuits SW1 and SW2 may be switched so that the sensing voltage Vs on the sensing node NDs and the reference voltage Vr on the reference node NDr may be isolated from the amplified voltages of the latch circuit 26.

The switch circuit SW1 is connected between the nodes NDs and NDi1, and the switch circuit SW2 is connected between the nodes NDr and NDi2. The switch circuits SW1 and SW2 are enabled in response to an enabled control signal C1 to respectively provide the sensing voltage Vs to the node NDi1 and provide the reference voltage Vr to the node NDi2. In this embodiment, the switch circuits SW1 and SW2 are PMOS transistors, and the control signal C1 has the enabled level (i.e., the low signal level) in an active period Tc' of the active period Tc, for example. Consequently, in the active period Td after the active period Tc, the latch circuit 26 can amplify the voltage difference between the sensing voltage Vs and the reference voltage Vr.

Figure 6:
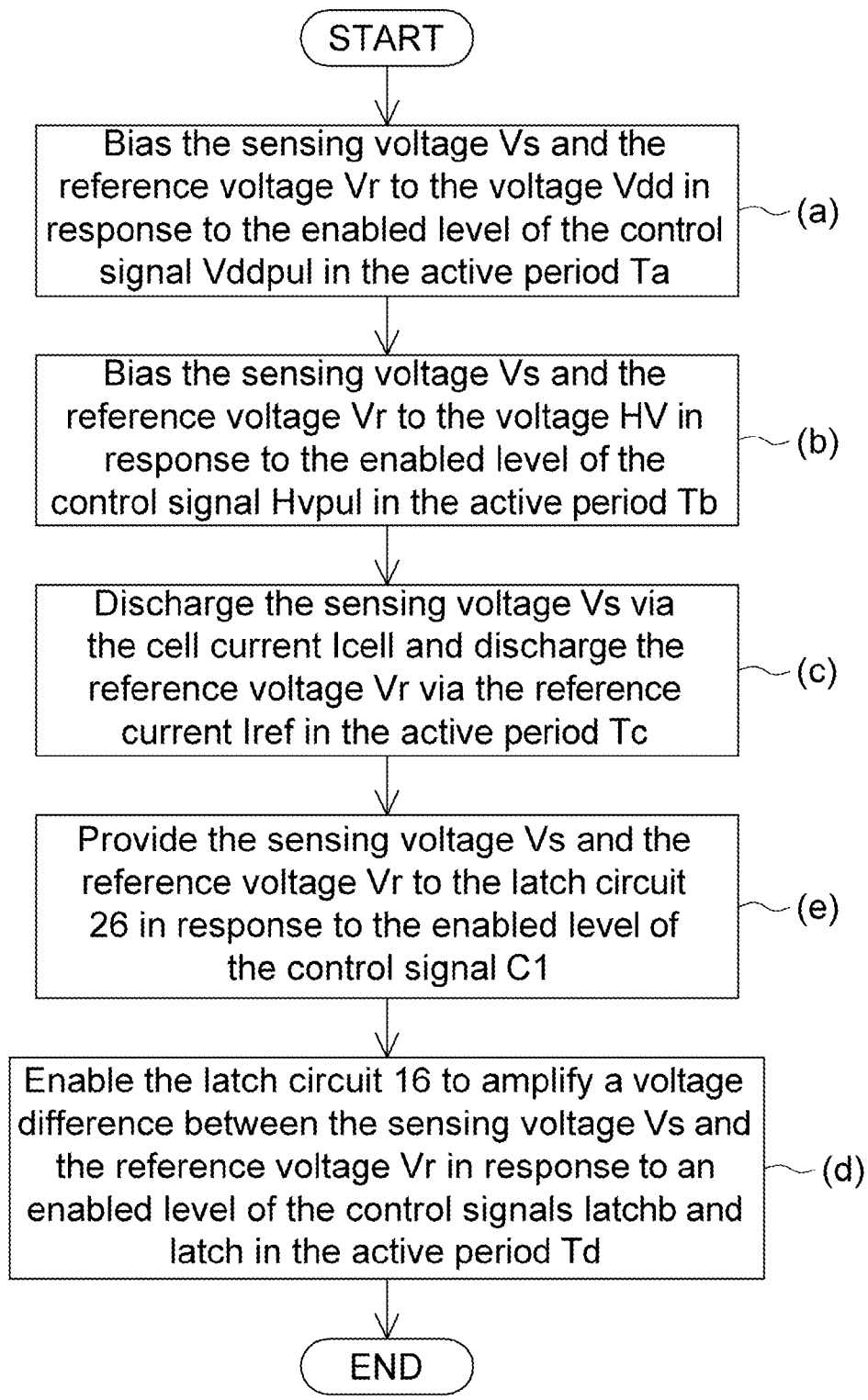
FIG. 6 is a flow chart showing a data sensing method according to the second embodiment of the invention.

FIG. 6 is a flow chart showing a data sensing method according to the second embodiment of the invention. Referring to FIG. 6, the difference between the sensing methods of the second and first embodiments is that the method further includes a step (e) between the steps (c) and (d). In the step (e), the switch circuits SW1 and SW2 provide the sensing voltage Vs on the sensing node NDs and the reference voltage Vr on the reference node NDr to the latch circuit 26 in response to the enabled level of the control signal C1.

Third Embodiment

Figure 7:
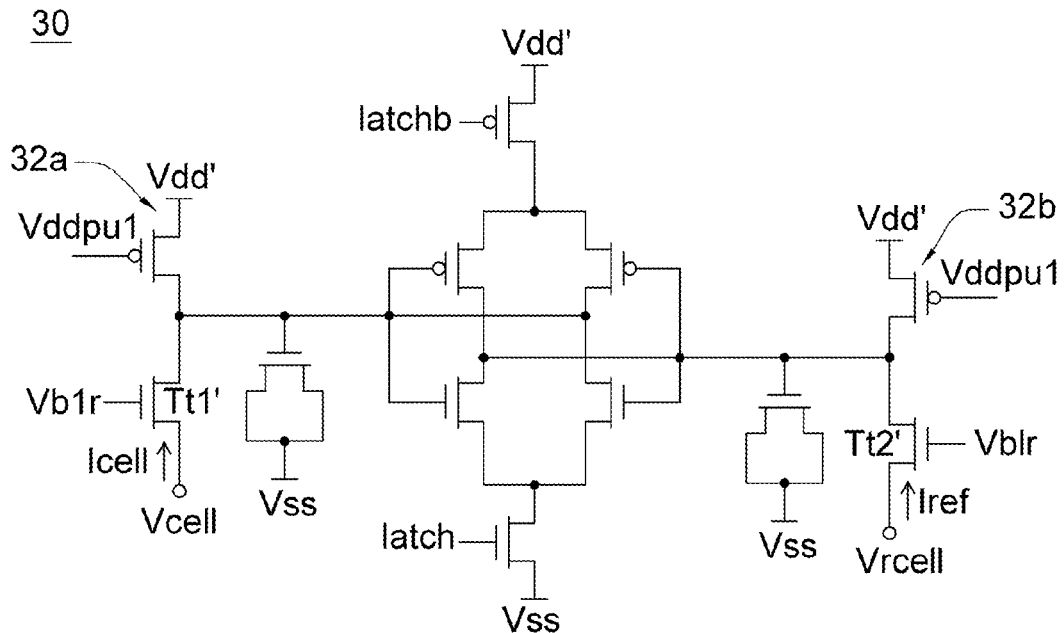
FIG. 7 is a circuit diagram showing a sense amplifier according to a third embodiment of the invention.

FIG. 7 is a circuit diagram showing a sense amplifier 30 according to a third embodiment of the invention. Referring to FIG. 7, the difference between the sense amplifier 30 of the third embodiment and the sense amplifier 10 of the first embodiment is that the bias circuits 18a and 18b, which respectively rise the sensing voltage Vs and the reference voltage Vr to the voltage HV, are omitted from the sense amplifier 30, and the sensing voltage Vs and the reference voltage Vr are respectively set only via bias circuits 32a and 32b for respectively rising the sensing voltage Vs and the reference voltage Vr to a voltage Vdd'.

In this embodiment, the level of the voltage Vdd' preferably makes the transistor Tt1' and Tt2' biased in the saturation region in the active period Tc. Therefore, the bias circuits 18a and 18b may be omitted. The sense amplifier 30 of this embodiment still can continuously bias transistors Tt1' and Tt2' to the saturation regions so that the cell current Icell and the reference current Iref also become substantially stable.

Fourth Embodiment

Figure 8:
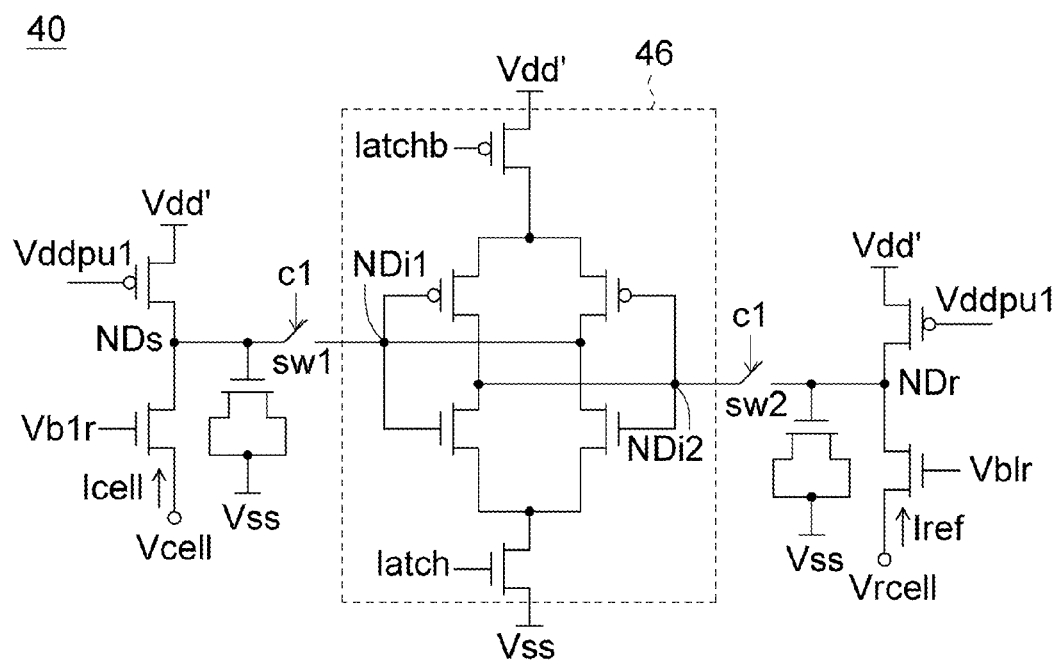
FIG. 8 is a circuit diagram showing a sense amplifier according to a fourth embodiment of the invention.

FIG. 8 is a circuit diagram showing a sense amplifier 40 according to a fourth embodiment of the invention. As shown in FIG. 8, the difference between the sense amplifier 40 of the fourth embodiment and the sense amplifier 30 of the third embodiment is that the sensing node NDs is connected to the node NDi1 of the latch circuit 16 via the switch circuit SW1 and the reference node NDr is connected to the node NDi2 of the latch circuit 16 via the switch circuit SW2. The switch circuits SW1 and SW2 may be switched such that the sensing voltage Vs on the sensing node NDs and the reference voltage Vr on the reference node NDr may be isolated from the amplified voltages of the latch circuit 16.

Thus, the second to fourth embodiments also have the advantages similar to those of the first embodiment. That is, the sensing margin of the sense amplifier becomes larger, the data sensing accuracy becomes higher, the values of the sensing current and the reference current become substantially stable, and it is possible to prevent the detection error of the storage data due to the unstable values of the sensing current and the reference current.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sense amplifier for sensing data stored in a memory cell of a memory, the sense amplifier comprising:
    a sensing node;
    a reference node;
    a first bias circuit, coupled to the sensing node, enabled in response to an enabled level of a first control signal for biasing the sensing node to a first voltage in response to the first control signal;
    a second bias circuit, coupled to the reference node, enabled in response to the enabled level of the first control signal for biasing the reference node to the first voltage in response to the first control signal;
    a third bias circuit, coupled to the sensing node, enabled in response to an enabled level of a second control signal for biasing the sensing node to a second voltage in response to the second control signal;
    a fourth bias circuit, coupled to the reference node, enabled in response to the enabled level of the second control signal for biasing the reference node to the second voltage in response to the second control signal;
    a first transmission circuit, coupled to the sensing node, for discharging the sensing node via the memory cell;
    a second transmission circuit, coupled to the reference node, for discharging the reference node via a reference memory cell; and
    a latch circuit enabled in response to an enabled level of a third control signal for amplifying a voltage difference between the sensing node and the reference node,
    wherein the first and second transmission circuits respectively comprise a first transistor having a first source/drain coupled to the sensing node, a second source/drain for receiving the cell current and a gate for receiving an enabled signal; and a second transistor having a first source/drain coupled to the reference node, a second source/drain for receiving the reference current and a gate for receiving the enabled signal, wherein the second voltage biases the first and second transistors to operate in saturation regions.

2. The sense amplifier according to claim 1, further comprising, wherein the first, second and third control signals have enabled levels respectively in a first period, a second period and a third period, the second period being between the first and third periods, and the first, second and third periods do not overlap with one another.

3. The sense amplifier according to claim 1, further comprising:
    a first switch having a first terminal coupled to the sensing node, and a second terminal coupled to a first input terminal of the latch circuit, wherein the first switch is enabled in response to an enabled level of a fourth control signal to provide a sensing voltage on the sensing node to the latch circuit; and
    a second switch having a first terminal coupled to the reference node, and a second terminal coupled to a second input terminal of the latch circuit, wherein the second switch is enabled in response to the enabled level of the fourth control signal to provide a reference voltage on the reference node to the latch circuit.

4. The sense amplifier according to claim 3, wherein the first, second, third and fourth control signals have enabled levels respectively in a first period, a second period, a third period and a fourth period, the fourth period being after the third period, and the first, second, third and fourth periods do not overlap with one another.

5. The sense amplifier according to claim 1, further comprising:
    a first capacitor having one terminal coupled to the sensing node and the other terminal for receiving a third voltage; and
    a second capacitor having one terminal coupled to the reference node and the other terminal for receiving the third voltage.

6. The sense amplifier according to claim 1, wherein the latch circuit comprises:
    a first inverter having a first input terminal, a first output terminal and a first power input terminal, wherein the first input terminal and the first output terminal are respectively coupled to the sensing node and the reference node;
    a second inverter having a second input terminal, a second output terminal and a second power input terminal, wherein the second input terminal and the second output terminal are respectively coupled to the reference node and the sensing node; and
    a third transistor having a first terminal for receiving a fourth voltage and a second terminal coupled to the first and second power input terminals, wherein the first transistor is enabled in response to a fifth control signal to provide the fourth voltage to enable the first and second inverters.

7. The sense amplifier according to claim 6, wherein the first and second inverters further respectively have a third power input terminal and a fourth power input terminal, and the latch circuit further comprises:
    a fourth transistor having a first terminal for receiving a fifth voltage and a second terminal coupled to the third and fourth power input terminals, wherein the second transistor is enabled in response to a sixth control signal to provide the fifth voltage to enable the first and second inverters.

8. A data sensing method for sensing storage data stored in a memory cell of a memory, the data sensing method comprising:
    biasing a sensing node and a reference node to a first voltage in response to a first control signal with a first biasing circuit;
    biasing the sensing node and the reference node to a second voltage in response to a second control signal with a second biasing circuit;
    discharging the sensing node with a cell current of the memory cell by a first transmission circuit, and discharging the reference node with a reference current of a reference memory cell by a second transmission circuit; and enabling a latch circuit with a voltage signal to amplify a voltage difference between the sensing node and the reference node, so as to sense the storage data, wherein the first and second transmission circuits respectively comprise a first transistor having a first source/drain coupled to the sensing node, a second source/drain for receiving the cell current and a gate for receiving an enabled signal; and a second transistor having a first source/drain coupled to the reference node, a second source/drain for receiving the reference current and a gate for receiving the enabled signal, wherein the second voltage biases the first and second transistors to operate in saturation regions.

9. The method according to claim 8, further comprising:
providing a sensing voltage on the sensing node and a reference voltage on the reference node to the latch circuit through switches respectively.

* * * * *